(12) United States Patent
Wang et al.

(10) Patent No.: US 10,374,571 B2
(45) Date of Patent: Aug. 6, 2019

(54) BALUN STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Xi Ning Wang, Shanghai (CN); Jen Hao Cheng, Shanghai (CN); Zhi Jiang Zhou, Shanghai (CN); Jin Feng Gao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 87 days.

(21) Appl. No.: 15/792,291

(22) Filed: Oct. 24, 2017

(65) Prior Publication Data
US 2018/0123550 A1 May 3, 2018

(30) Foreign Application Priority Data
Nov. 1, 2016 (CN) .......................... 2016 1 0942121

(51) Int. Cl.
*H03H 7/42* (2006.01)
*H01F 17/00* (2006.01)
(Continued)

(52) U.S. Cl.
CPC ............ *H03H 7/42* (2013.01); *H01F 17/0013* (2013.01); *H01F 21/12* (2013.01);
(Continued)

(58) Field of Classification Search
CPC ........................................................ H03H 7/42
(Continued)

(56) References Cited

U.S. PATENT DOCUMENTS 7,570,144 B2 *  8/2009  Lim .................... H01F 17/0006
                                                  336/200
7,692,511 B2 *  4/2010  Degani ............... H01F 17/0013
                                                  333/238
(Continued)

*Primary Examiner* — Dean O Takaoka
(74) *Attorney, Agent, or Firm* — Anova Law Group, PLLC

(57) ABSTRACT

A balun structure is provided. The balun structure includes a substrate, a first coil structure and a second coil structure having a spiral shape and on the substrate. The first coil structure includes a first single-layer coil surrounding by first laminated coils that are connected to the first single-layer coil. The second coil structure can include a second single-layer coil and second laminated coils that are connected to the second single-layer coil. A projection of the first single-layer coil and a projection of the second single-layer coil on a surface of the substrate overlap with each other. A number of the second laminated coils is larger than or equal to a number of the first laminated coils. The second laminated coils are arranged alternately with the first laminated coils or the first single-layer coil in a plane parallel to the surface of the substrate.

20 Claims, 5 Drawing Sheets

(51) Int. Cl.
*H01F 21/12* (2006.01)
*H01F 27/28* (2006.01)
*H01L 23/522* (2006.01)

(52) U.S. Cl.
CPC ..... *H01F 27/2804* (2013.01); *H01L 23/5227* (2013.01); *H01F 2017/0073* (2013.01)

(58) Field of Classification Search
USPC ..................................... 333/25, 26; 336/200
See application file for complete search history.

(56) References Cited

U.S. PATENT DOCUMENTS

| | | | | |
|---|---|---|---|---|
| 8,198,970 B2* | 6/2012 | Choi | ................... | H01F 17/0013 336/200 |
| 8,552,812 B2* | 10/2013 | Yen | ..................... | H01L 23/5223 333/25 |
| 2019/0068157 A1* | 2/2019 | Wang | ....................... | H03H 7/42 |

* cited by examiner

BALUN STRUCTURE

CROSS-REFERENCES TO RELATED APPLICATIONS

This application claims the priority of Chinese Patent Application No. 201610942121.7, filed on Nov. 1, 2016, the entire contents of which are incorporated herein by reference.

FIELD OF THE DISCLOSURE

The present disclosure generally relates to the field of semiconductor fabricating technology and, more particularly, relates to a balun structure.

BACKGROUND

In complementary metal-oxide-semiconductor (CMOS) radio frequency integrated circuits (RFIC), a balun structure is an important electrical structure that is mainly used to achieve a conversion between an unbalanced signal and a balanced signal.

Inductor is one of the core components of the balun structure, and the performance parameters of the inductor are directly related to the performance of the balun structure. The inductors in the integrated circuits are mainly planar inductors, such as a planar spiral inductor. The planar spiral inductor can be formed by wounding a metal wire on the surfaces of a substrate or a dielectric layer. Compared with a conventional wire inductor, the planar inductor may have many advantages such as low cost, easy integration, low noise, low power consumption, etc. More importantly, the planar inductor can be compatible with existing integrated circuit processes.

Inductor quality factor Q and insertion loss (IL) are two main factors that affect the performance of the balun structure. The inductor quality factor Q and the insertion loss are related to the performance of the radio frequency (RF) front-end circuit in the balanced mixer, and the amplifier-related limit noise, power loss, etc.

In order to improve the inductor quality factor Q and reduce the insertion loss, an area of the coil in the balun structure can be generally large, which results in a large area of the wafer occupied by the coil in the balun structure.

Accordingly, the disclosed balun structure is directed to solve one or more problems set forth above and other problems.

BRIEF SUMMARY OF THE DISCLOSURE

One aspect of present disclosure provides a balun structure, comprising: a substrate; a first coil structure having a spiral shape and on the substrate, the first coil structure including: a first single-layer coil, and at least one first laminated coil connected to the first single-layer coil, wherein the first single-layer coil is surrounded by the at least one first laminated coil; and a second coil structure having a spiral shape and on the substrate, the second coil structure including: a second single-layer coil, a projection of the second single-layer coil on a surface of the substrate overlaps a projection of the first single-layer coil on the surface of the substrate, and at least one second laminated coil connected to the second single-layer coil, wherein a number of the at least one second laminated coil is larger than or equal to a number of the at least one first laminated coil, and the at least one second laminated coil is arranged alternately with the at least one first laminated coil or the first single-layer coil in a plane parallel to the surface of the substrate.

Other aspects of the present disclosure can be understood by those skilled in the art in light of the description, the claims, and the drawings of the present disclosure.

BRIEF DESCRIPTION OF THE DRAWINGS

Various objectives, features, and advantages of the present disclosure can be more fully appreciated with reference to the detailed description of the present disclosure when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Reference input now be made in detail to exemplary embodiments of the invention, which are illustrated in the accompanying drawings in order to fully understand and being able to implementing the present disclosure and to realizing the technical effect. It should be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

A balm structure may be referred to the meaning of "balanced-unbalanced" structure. The existing balun structure has a problem of occupying a too large area.

Figure 1:
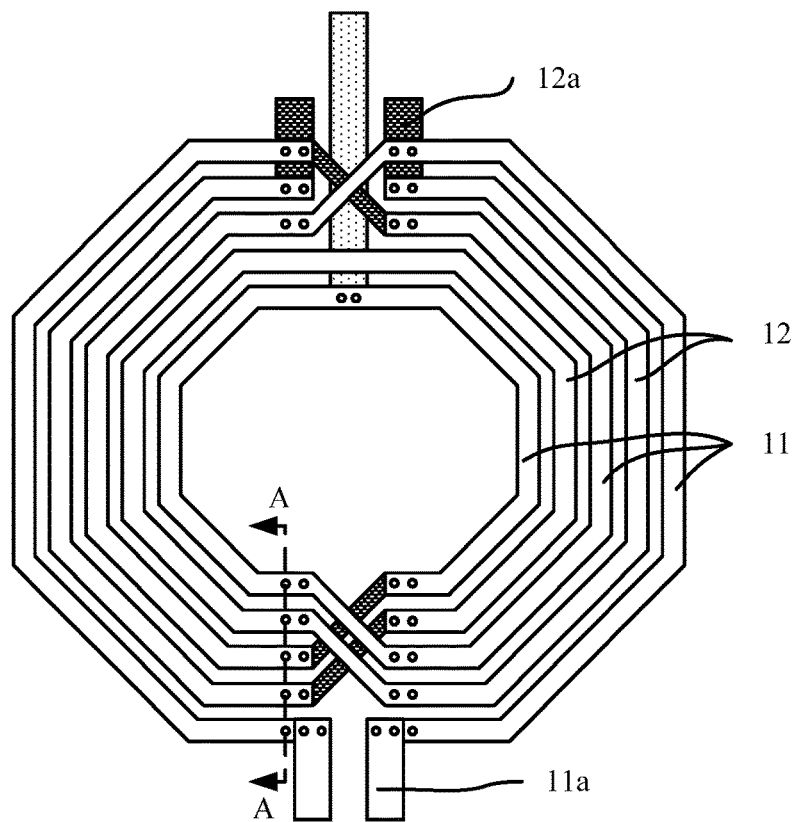
FIG. 1 illustrates a schematic structural top view of a balun structure.
Figure 2:
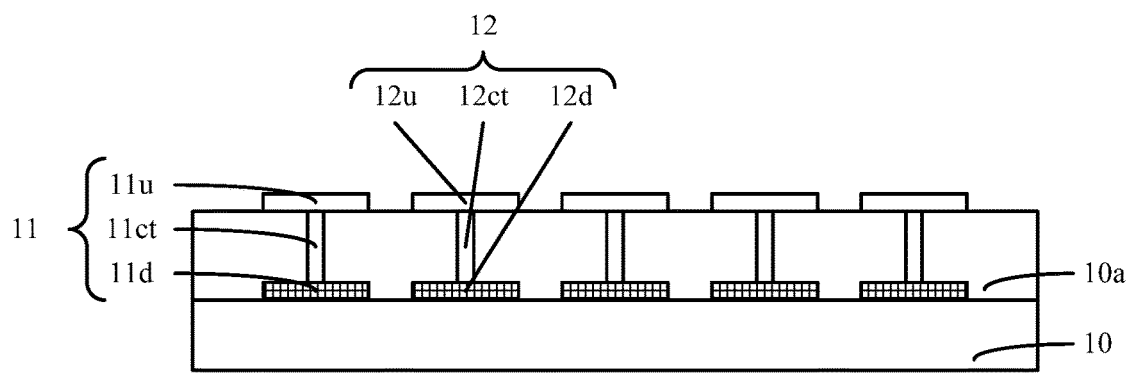
FIG. 2 illustrates a schematic structural cross-sectional view of the balun structure shown in FIG. 1 along an AA line.

Referring to FIG. 1, a schematic structural top view of a balun structure is shown. FIG. 2 illustrates a schematic structural cross-sectional view of the balun structure shown in FIG. 1 along an AA line.

As illustrated in FIG. 2, the balun structure includes a substrate 10 having a dielectric layer 10a on the surface of the substrate 10. The balun structure further includes a first coil structure 11a in a spiral shape and a second coil structure 12a in a spiral shape on the substrate 10. The balun structure includes a differential coil and a spiral coil. The first coil structure 11a is a differential coil, and the second coil structure 12a is a spiral coil. Note that the substrate 10 and the dielectric layer 10a are not shown in FIG. 1.

As illustrated in FIG. 1, the first coil structure 11a includes at least a first laminated coil 11 including a first lower-layer metal wire 11d on the substrate 10. The first coil structure 11a further includes a first upper-layer metal wire 11u located on the dielectric layer 10a, and a first conductive plug 11ct located in the dielectric layer 10a between the first lower-layer metal wire 11d and the first upper-layer metal wire 11u.

The projection of the first upper-layer metal wire 11u on the surface of the substrate 10 overlaps the projection of the first lower-layer metal wire 11d on the surface of the substrate 10. The first lower-layer metal wire 11d and the first upper-layer metal wire 11u are connected in parallel through the first conductive plug 11ct.

The second coil structure 12a includes at least a second laminated coil 12 including a second lower-layer metal wire 12d on the substrate 10. The second coil structure 12a further includes a second upper-layer metal wire 12u located on the dielectric layer 10a, and a second conductive plug 12ct located in the dielectric layer 10a between the second lower-layer metal wire 12d and the second upper-layer metal wire 12u.

The projection of the second upper-layer metal wire 12u on the surface of the substrate 10 overlaps the projection of the second lower-layer metal wire 12d on the surface of the substrate 10. The second lower-layer metal wire 12d and the second upper-layer metal wire 12u are connected in parallel through the second conductive plug 12ct.

Since the first lower-layer metal wire 11d and the first upper-layer metal wire 11u are connected in parallel to each other in the first coil structure 11a, and the second lower-layer metal wire 12d and the second upper-layer metal wire 12u are connected in parallel to each other in the second coil structure 12, the electromagnetic coupling between the first coil structure 11 and the second coil structure 12 is achieved by an electromagnetic coupling between the first lower-layer metal wire 11d and the second lower-layer metal wire 12d, and an electromagnetic coupling between the first upper-layer metal wire 11u and the second upper-layer metal wire 12u.

That is, the electromagnetic coupling between the first coil structure 11 and the second coil structure 12 is achieved in the lateral direction of the plane parallel to the surface of the substrate 10. Thus, the electromagnetic coupling area is small, and the coupling efficiency is low. In order to achieve an equivalent electromagnetic coupling effect, the numbers of turns of the first coil structure 11 and the second coil structure 12 in the balun structure are increased, thereby increasing the occupied area.

The present disclosure provides a balun structure. The balun structure includes a substrate, a first coil structure and a second coil structure on the substrate.

The first coil structure may have a spiral shape. The first coil structure may include a first single-layer coil, and at least one first laminated coil connected to the first single-layer coil. The at least one first laminated coil can surround the first single-layer coil.

The second coil structure may have a spiral shape. The second coil structure may include a second single-layer coil, and at least one second laminated coil connected to the second single-layer coil. The projection of the second single-layer coil on the surface of the substrate can overlap the projection of the first single-layer coil on the surface of the substrate. The number of the at least one second laminated coil can be larger than or equal to the number of the at least one first laminated coil. The at least one second laminated coil can be parallel to the surface of the substrate. The at least one second laminated coil can be arranged alternately with the at least one first laminated coil or the first single-layer coil.

In the disclosed balun structure, the first coil structure includes a first single-layer coil, and the second coil structure includes a second single-layer coil. The projection of the second single-layer coil on the surface of the substrate can overlap the projection of the first single-layer coil on the surface of the substrate. Therefore, the electromagnetic coupling between the first coil structure and the second coil structure can be achieved not only in the lateral direction in the plane paralleled to the surface of the substrate, but also in the vertical direction of the surface of the substrate between the first single-layer coil and the second single-layer coil.

Therefore, the area of the electromagnetic coupling between the first coil structure and the second coil structure can be effectively increased, thereby providing an improved electromagnetic coupling efficiency. For the same electromagnetic coupling requirement, the disclosed balun structure can have reduced numbers of the first laminated coils and the second laminated coils. As such, it is possible to effectively reduce the area of the first coil structure and the second coil structure, thereby reducing the occupied area of the balun structure.

Referring to FIGS. 3-6, schematic structural diagrams of an exemplary balun structure are illustrated in accordance with some embodiments of the present disclosure.

Figure 3:
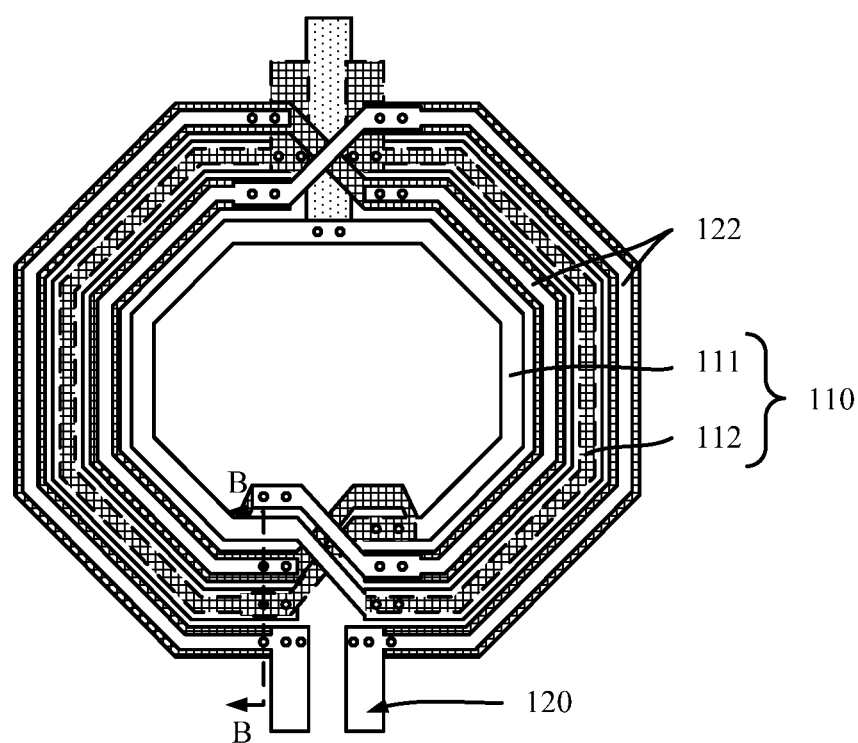
FIG. 3 illustrates a schematic structural top view of an exemplary balun structure in accordance with some embodiments of the present disclosure.
Figure 4:
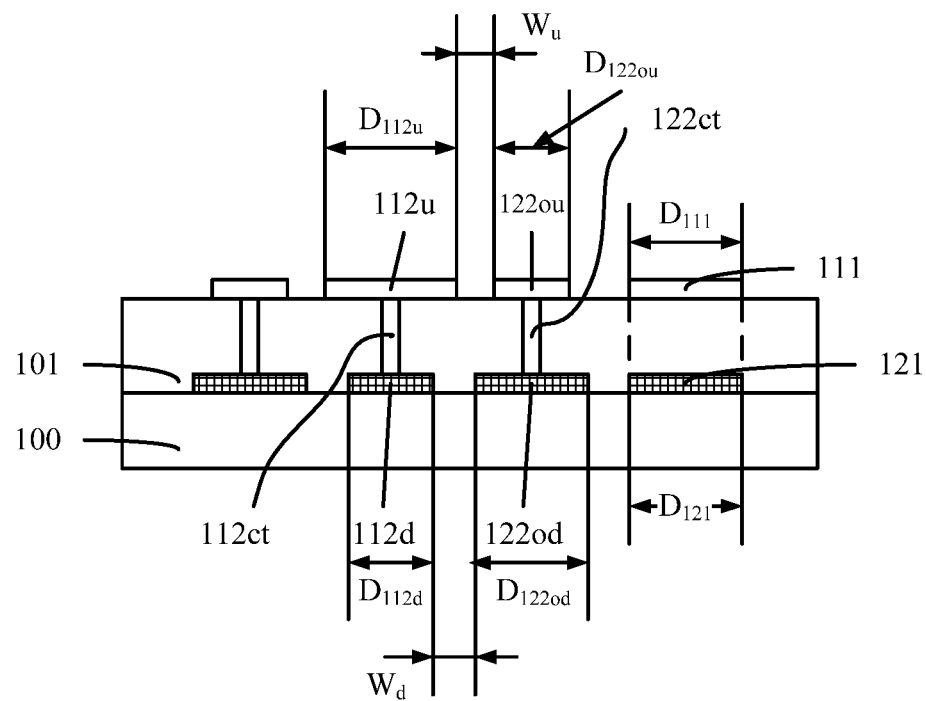
FIG. 4 illustrates a schematic structural cross-sectional view of the balun structure shown in FIG. 3 along a BB line.

Turning to FIG. 3, a schematic structural top view of the balun structure is shown. FIG. 4 illustrates a schematic structural cross-sectional view of the balun structure shown in FIG. 3 along a BB line.

As illustrated, the balun structure can include a substrate 100 shown in FIG. 4, and a first coil structure 110 and a second coil structure 120, on the substrate 100.

The first coil structure 110 may have a spiral shape. The first coil structure 110 may include a first single-layer coil 111, and at least one first laminated coil 112 connected to the first single-layer coil 111. The at least one first laminated coil 112 can surround the first single-layer coil 111.

The second coil structure 120 may have a spiral shape. The second coil structure 120 may include a second single-layer coil 121 shown in FIG. 4, and at least one second laminated coil 122 connected to the second single-layer coil. The projection of the second single-layer coil 121 on the surface of the substrate 100 can overlap the projection of the first single-layer coil 111 on the surface of the substrate 100. The number of the at least one second laminated coil 122 can be larger than or equal to the number of the at least one first laminated coil 112. The at least one second laminated coil 122 can be parallel to the surface of the substrate 100. The at least one second laminated coil 122 can be arranged alternately with the at least one first laminated coil 112 or the first single-layer coil 111.

It should be noted that, the balun structure includes a differential coil and a spiral coil. In some embodiments, the first coil structure 110 is a spiral coil, and the second coil structure 120 is a differential coil. In some other embodiments, the first coil structure 110 is a differential coil, and the second coil structure 120 is a spiral coil.

As shown in FIG. 4, the substrate 100 can be used to provide a process operation platform. Specifically, in some embodiments, the substrate 100 can be a single-crystal silicon substrate. The material of the substrate 100 may also be selected from polysilicon or amorphous silicon. In some other embodiments, the substrate may also include other semiconductor materials such as germanium, gallium arsenide, or germanium silicon. Further, in some other embodiments, the substrate may have a semiconductor structure such as an epitaxial layer, or a silicon structure on an epitaxial layer.

In some embodiments, the balun structure further includes a dielectric layer 101 on the substrate 100 to effect electrical isolation between adjacent semiconductor structures and conductive materials.

A material of dielectric layer 101 may be selected from the group of silicon oxide, silicon nitride, silicon oxynitride, low-k dielectric material having a dielectric constant greater than or equal to 2.5 and less than 3.9, ultra-low K dielectric material having a dielectric constant less than 2.5, and any suitable combination thereof. In one specific embodiment, the material of the dielectric layer 101 is silicon oxide.

It should be noted that, the substrate 100 and the dielectric layer 101 are not shown in FIG. 3 in order to facilitate a clear illustration of the internal structure of the balun structure.

The first coil structure 110 can be a first winding of the balun structure, and the second coil structure 120 can be a second winding of the balun structure. The balun structure can achieve the voltage-transform function through the electromagnetic induction between the first coil structure 110 and the second coil structure 120.

As shown in FIG. 4, in the first coil structure 110, the first single-layer coil 111 can be located on the dielectric layer 101. In the second coil structure 120, the second single-layer coil 121 can be located on the substrate 100. That is, the second single-layer coil 121 can be located in the dielectric layer 101 between the first single-layer coil 111 and the substrate 100. The first single-layer coil 111 and the second single-layer coil 121 can be electrically isolated by the dielectric layer 101.

Since the first single-layer coil 111 can be used to constitute the first coil structure 110, and the second single-layer coil 121 can be used to constitute the second coil structure 120, the first coil structure 110 and the second coil structure 120 can realize the electromagnetic coupling in the direction of the surface of the vertical substrate 100 through the first single-layer coil 111 and the second single-layer coil 121. Further, the projections of the first single-layer coil 111 and the second single-layer coil 121 on the surface of the substrate 100 can be overlapped with each other. Besides the electromagnetic coupling in the direction parallel to the surface of substrate 100, the electromagnetic coupling can also be achieved in the vertical direction of the surface of substrate 100 between the first single-layer coil 111 and the second single-layer coil 121. Thus, the total of the area of the electromagnetic coupling can be enlarged.

The arrangement of the first coil structure 110 and the second coil structure 120 can effectively improve the electromagnetic coupling efficiency between the first coil structure 110 and the second coil structure 120, thereby contributing to the reduction of the insertion loss and the improvement of the inductor quality factor Q of the balun structure.

In the same coupling requirement, the improvement of the electromagnetic coupling efficiency between the first coil structure 110 and the second coil structure 120 can effectively reduce the numbers of the wingdings in the first coil structure 110 and the second coil structure 120. Therefore, the areas of the first coil structure 110 and the second coil structure 120 can be reduced, and the occupied area of the balun structure can be reduced.

In some embodiments, the projection of the second single-layer coil 121 on the surface of the substrate 100 can overlap the projection of the first single-layer coil 111 on the surface of the substrate 100. That is, a linewidth D111 of the first single-layer coil 111 can be equal to a linewidth D121 of the second single-layer coil 121. Thus, the overlap area between the first single-layer coil 111 and the second single-layer coil 121 can be effectively increased, so that the electromagnetic coupling efficiency between the first coil structure 110 and the second coil structure 120 can be improved.

Specifically, the linewidth D111 of the first single-layer coil 111 and the linewidth D121 of the second single-layer coil can be in a range from about 1 μm to about 100 μm. In some embodiments, the linewidth D111 of the first single-layer coil 111 and the linewidth D121 of the second single-layer coil can be in a range from about 5.5 μm to about 6.5 μm, such as about 5.5 μm, about 6.0 μm or about 6.5 μm.

Figure 5:
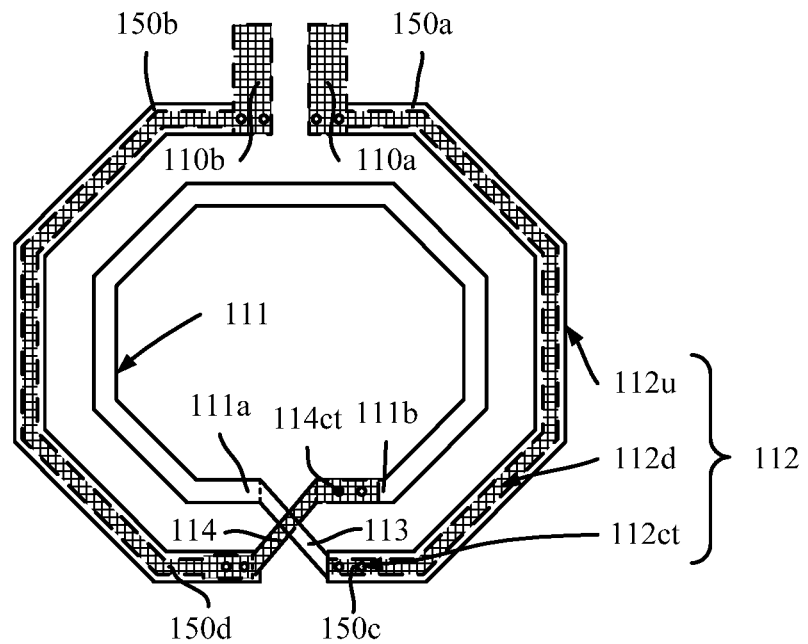
FIG. 5 illustrates a schematic structural top view of an exemplary differential coil shown in FIG. 3.

Referring to FIG. 5, a schematic structural top view of an exemplary differential coil shown is shown. Note that, the differential coil can be the first coil structure 110 shown in FIG. 3. The substrate and the dielectrically layer are not shown in FIG. 5.

The first coil structure 110 can further include at least one first laminated coil 112 connected to the first single-layer coil 111. The number of the at least one first laminated coils 112 can be larger than or equal to 1, and less than or equal to 4.

In some embodiments, the number of the first laminated coil 112 is 1. That is, the first coil structure 110 can include one first single-layer coil 111 and one first laminated coil 112 that surrounds the first single-layer coil 111.

The first single-layer coil 111 can include a first end 111a and a second end 111b for connecting with the first laminated coil 112.

The first laminated coil 112 can include multiple first upper-layer metal wires 112u located on the dielectric layer 101, multiple first lower-layer metal wires 112d located on the substrate 100. The multiple first lower-layer metal wires 112d can be located at the positions corresponding to the multiple first upper-layer metal wires 112u. The first laminated coil 112 can further include a first conductive plug 112ct between the first upper-layer metal wires 112u and the first lower-layer metal wires 112d.

In order to realize the connection between the first single-layer coil 111 and the first laminated coil 112, the first coil structure 110 can further include a first connecting line 113 on the dielectric layer 101. One end of the first connecting line 113 can be connected to the first end 111a of the first single-layer coil 111, and the other end of the first connecting line 113 can be connected to one end of one adjacent first upper-layer metal wire 112u.

The first coil structure 110 can further include a second connecting line 114, and a first connecting plug 114ct located at a first end of the second connecting line 114. The first end of the second connecting line 114 can be connected to the second end 111b of the first single-layer coil 111 through the first connecting plug 114ct, a second end of the second connecting line 114 can be connected to one adjacent first lower-layer metal wire 112d.

In order to make the first coil structure 110 in a spiral shape, the first connecting line 113 and the second connecting line 114 can be arranged in an "X" shape. That is, the projections of the first connecting line 113 and the second connecting line 114 on the surface of the substrate 100 can overlap to each other. And the projections of the first connecting line 113 and the second connecting line 114 on the surface of the substrate 100 can have an "X" shape.

In some embodiments, the number of the first laminated coil 112 in the first coil structure 110 can be one. The first laminated coil 112 can include one first upper-layer metal wire 112u and one first lower-layer metal wire 112d.

The first upper-layer metal wire 112u can include a first line segment 150a and a second line segment 150b that are located on the dielectric layer 101. The first line segment 150a and the second line segment 150b can be located on both sides of the first single-layer coil 111 respectively. And one end of the first line segment 150a can be directly connected to one end of the first connecting line 113.

The first lower-layer metal wire 112d can include a third line segment 150c and a fourth line segment 150d that are located on the substrate 100. The third line segment 150c can be located at a position corresponding to the first line segment 150a, i.e., within the dielectric layer 101 between the first line segment 150a and the substrate 100. The two ends of the third line segment 150c can have two first conductive plugs 112ct. The third line segment 150c can be connected in parallel with the first line segment 150a through the first conductive plugs 112ct.

The fourth line segment 150d can be located at a position corresponding to the second line segment 150b, i.e., within the dielectric layer between the second line segment 150b and the substrate 100. The two ends of the fourth line segment 150d can also have two first conductive plugs 112ct. The fourth line segment 150d can be connected in parallel with the second line segment 150b through the first conductive plugs 112ct.

One end of the fourth line segment 150d can be directly connected to the end of the second connecting line 114 where the first connecting plug 114ct is not provided. One end of the first connecting line 113 can be connected to the first end 111a of the first single-layer coil 111, and the other end of the first connecting line 113 can be connected to the first line segment 150a. One end of the second connecting line 114 can be connected to the second end 111b of the first single-layered coil 111 through the first connecting plug 114ct, and the other end of the second connecting line 114 can be connected to the fourth line segment 150d.

In some embodiments, the first coil structure 110 can further include a first connection terminal 110a and a second connection terminal 110b for inputting voltage signals. The first connection terminal 110a and the second connection terminal 110b can be located on the substrate 100 and in the same layer as the first lower-layer metal wire 112d. One end of the third line segment 150c can be connected to the first connection terminal 110a. The second connection end 110b can be connected to one end of the fourth line segment 150d that is away from the second connecting line 114. That is, the second connection end 110b is connected to one end of the fourth line segment 150d that is not connected to the second connecting line 114.

Figure 6:
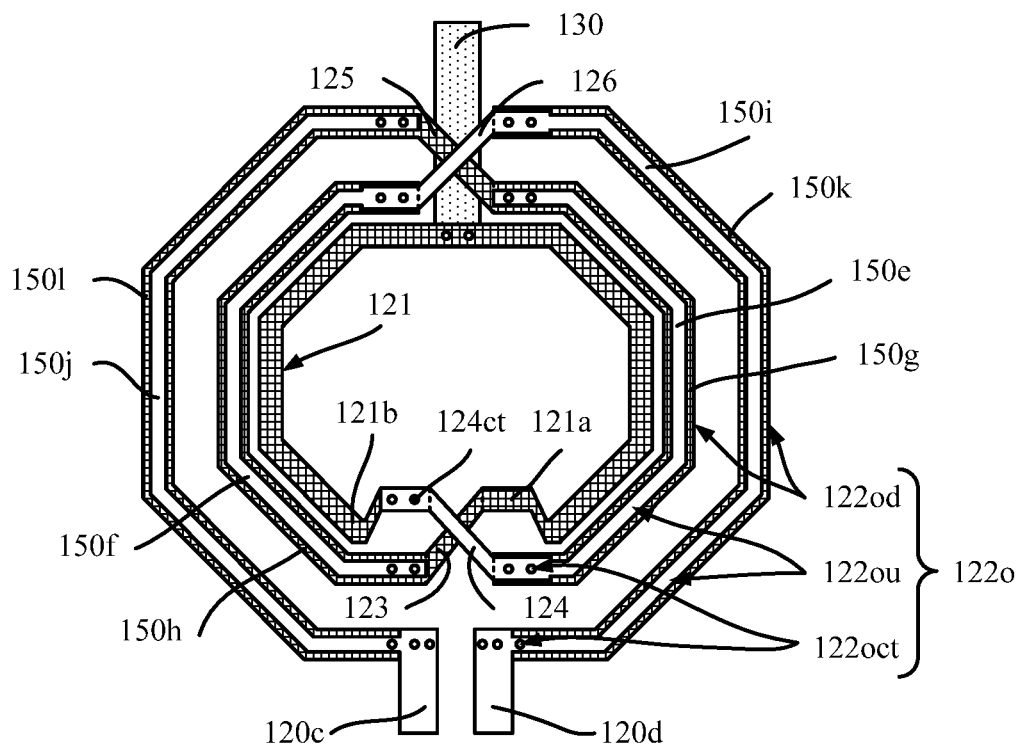
FIG. 6 illustrates a schematic structural top view of an exemplary spiral coil shown in FIG. 3.

Referring to FIG. 6, a schematic structural top view of an exemplary spiral coil is shown. It should be noted that, the spiral coil can be the second coil structure 120 shown in FIG. 3. The substrate and the dielectric layer are not shown in FIG. 6.

The second coil structure 120 can further include at least one second laminated coil 122 connected to the second single-layer coil 121. The number of the at least one second laminated coils 122 can be larger than or equal to 1, and less than or equal to 4. In some embodiments, the at least one second laminated coil 122 can be outer second laminated coil 122o surrounding the second single-layer coil 121.

In some embodiments, the number of the outer second laminated coil 112 is 2. That is, the second coil structure 120 can include one second single-layer coil 121 and two outer second laminated 122 that surrounds the second single-layer coil 121.

The second single-layer coil 121 can include a third end 121a and a fourth end 121b for connecting with the adjacent second laminated coil 112.

The outer second laminated coil 122 can include multiple outer second upper-layer metal wires 122ou located on the dielectric layer 101, multiple outer second lower-layer metal wires 122od located on the substrate 100. The multiple outer second lower-layer metal wires 122od can be located at the positions corresponding to the multiple outer second upper-layer metal wires 122ou. The second laminated coil 122 can further include multiple second conductive plugs 122oct between the outer second upper-layer metal wires 122ou and the outer second lower-layer metal wires 122od.

In order to realize the connection between the second single-layer coil 121 and the second laminated coils 122o, the second coil structure 120 can further include a third connecting line 123 on the substrate. One end of the third connecting line 123 can be connected to the third end 121a of the second single-layer coil 121, and the other end of the third connecting line 123 can be connected to one end of one adjacent outer second lower-layer metal wire 122od.

The second coil structure 120 can further include a fourth connecting line 124, and a second connecting plug 124ct located at a first end of the fourth connecting line 124. The first end of the fourth connecting line 124 can be connected to the fourth end 121b of the second single-layer coil 121 through the second connecting plug 124ct, a second end of the fourth connecting line 124 can be connected to one adjacent out second upper-layer metal wire 122ou.

It should be noted that, in order to make the second coil structure 120 in a spiral shape, the third connecting line 123 and the fourth connecting line 124 can be arranged in an "X" shape. That is, the projections of the third connecting line 123 and the fourth connecting line 124 on the surface of the substrate 100 can overlap to each other. And the projections of the third connecting line 123 and the fourth connecting line 124 on the surface of the substrate 100 can have an "X" shape.

In some embodiments, the number of the second laminated coils 112 is two in the second coil structure 110. That is, the second laminated coils 112 include an outer second inner laminated coil and an outer second outer laminated coil. The outer second inner laminated coil includes one outer second upper-layer metal wire 122ou and one outer second lower-layer metal wire 122od. The outer second outer laminated coil also includes one outer second upper-layer metal wire 122ou and one outer second lower-layer metal wire 122od.

The outer second inner coil is adjacent to the second single-layer coil 121. The outer upper-layer metal wire 122ou of the outer second inner laminated coil can include a fifth line segment 150e and a sixth line segment 150f that are located on both sides of the second single-layer coil 121 respectively. One end of the fifth line segment 150a can be connected to one end of the fourth connecting line 124 that does not have the second connecting plug 124ct.

The outer second lower-layer metal wire 122od of the outer second inner laminated inner coil includes a seventh line segment 150g and an eighth line segment 150h. The seventh line segment 150g can be located at a position corresponding to the fifth line segment 150e, e.g., within the dielectric layer 101 between the fifth line segment 150e and the substrate 100. Two ends of the seventh line segment 150g can have two second conductive plugs 122oct. The seventh line segment 150g can be connected in parallel with the fifth line segment 150e through the second conductive plugs 122oct.

The eighth line segment 150h can be located at a position corresponding to the sixth line segment 150f, e.g., within the dielectric layer 101 between the sixth line segment 150f and the substrate 100. Two ends of the eighth line segment 150h can have two second conductive plugs 122oct. The eighth line segment 150h can be connected in parallel with the sixth line segment 150f through the second conductive plugs 122oct.

One end of the eighth line segment 150h can be directly connected to the third connecting line 123. One end of the third connecting line 123 can be connected to the third end 121a of the second single-layer coil 121, and the other end of the third connecting line 123 can be connected to the eighth line segment 150h. One end of the fourth connecting line 124 can be connected to the fourth end 121b of the second single-layer coil 121 through the second connecting plug 124ct, and the other end of the fourth connecting line 124 can be connected to the fifth line segment 150e.

As shown in FIG. 3, the outer second laminated outer coil can surround the outer second laminated inner coil. The second laminated coils 122 can be disposed alternately with the first laminated coil 112 or the first single-layered coil 111 in the plane parallel to the surface of the substrate 100. In some embodiments, the two second laminated coils 122 are positioned on both sides of the first laminated coil 112.

Specifically, the outer second inner coil is positioned between the first laminated coil 112 and the first single-layer coil 111, and the outer second outer laminated coil is positioned on one side of the first laminated coil 112 that is away from the first single-layer coil 111.

In order to realize the connection between the outer second laminated outer coil and the outer second inner laminated coil, the second coil structure can further include a fifth connecting line 25 located on the substrate. One end of the fifth connecting line 125 can be connected to one end of the seventh line segment 150g. The second coil structure can further include a sixth connecting line 126 located on the dielectric layer. One end of the sixth connecting line 126 can be connected to one end of the sixth line segment 150f.

One end of the seventh line segment 150g that is close to the fourth connecting line 124 can be connected to the fifth line segment 150e through the second conductive plugs 122oct, and the other end of the seventh line segment 150g can be connected to the fifth connecting line 125. One end of the sixth line segment 150f that is close to the third connecting line 123 can be connected to the eighth line segment 150h through the second conductive plugs 122oct, and the other end of the sixth line segment 150f can be connected to the sixth connecting line 126.

The outer second upper-layer metal wire 122ou of the outer second inner laminated coil can include a ninth line segment 150i and a tenth line segment 150j. The ninth line segment 150i and the tenth line segment 150j can be located on both sides of the second single-layer coil 121 respectively. One end of the ninth line segment 150i can be connected to one end of the sixth connecting line 126.

The outer second lower-layer metal wire 122od of the outer second inner laminated coil can include an eleventh line segment 150k and a twelfth line segment 150l.

The eleventh line segment 150k can be located at a position corresponding to the ninth line segment 150i, e.g., within a dielectric layer between the ninth line segment 150i and the substrate. Both ends of the eleventh line segment 150k can have the second conductive plugs 122oct. The eleventh line segment 150k can be connected in parallel with the ninth line segment 150i through the second conductive plugs 122oct.

The twelfth line segment 150l can be located at a position corresponding to the tenth line segment 150j, e.g., within a dielectric layer between the tenth line segment 150j and the substrate. Both ends of the twelfth line segment 150l can have the second conductive plugs 122oct. The twelfth line segment 150l can be connected in parallel with the tenth line segment 150j through the second conductive plugs 122oct.

One end of the twelfth line segment 150l can be directly connected to the fifth connecting line 125. One end of the fifth connecting line 125 can be connected to the seventh line segment 150g, and the other end of the fifth connecting line 125 can be connected to the twelfth line segment 150l. One end of the sixth connecting line 126 can be connected to the sixth line segment 150f, and the other end of the sixth connecting line 126 can be connected to the ninth line segment 150i.

In order to make the second coil structure 120 spiral, the fifth connecting line 125 and the sixth connecting line 126 can be arranged in an "X" shape. That is, the projections of the fifth connecting line 125 and the sixth connecting line 126 on the surface of the substrate can overlap to each other. And the projections of the fifth connecting line 125 and the sixth connecting line 126 on the surface of the substrate can have an "X" shape.

In addition, in some embodiments, the second coil structure 120 can further include a third connection terminal 120c and a fourth connection terminal 120d for outputting voltage signals. The third connection terminal 120c and the fourth connection terminal 120d can be located on the dielectric layer and in the same layer as the outer second upper-layer metal wire 122ou. The third connection terminal 120c can be connected to one end of the tenth line segment 150j that is away from the fifth connecting line 125. The fourth connection terminal 120d can be connected to one end of the ninth line segment 150i that is away from the sixth connecting line 126.

In some embodiments, the second coil structure 120 can be a differential coil in the balun structure. Thus, the second coil structure 120 can further include a center tap 130. In some embodiments, the center tap 130 can be connected to the second single-layer coil 121.

Still referring to FIG. 4, in order to reduce the occupied area of the balun structure, in some embodiments, the linewidth D112u of the first upper-layer metal wire 112u can be larger than the linewidth D112d of the first lower-layer metal wire 112d. And the linewidth D122ou of the outer second upper-layer metal wire 122ou can be smaller than the linewidth D122od of the outer second lower-layer metal wire 122od.

In the cross section that is vertical to the extension direction, the cross section of the first coil structure including the first upper-layer metal wire 112u and the first lower-layer metal wire 112d can have a first "I" shape, where the upper transverse line of the first "I" shape is longer than the lower transverse line of the first "I" shape. The cross section of the second coil structure including the outer second upper-layer metal wire 122ou and the outer second lower-layer metal wire 122od can have a second "I" shape, where the upper transverse line of the second "I" shape is shorter than the lower transverse line of the second "I" shape.

The first coil structure and the second coil structure having the above-described shapes are advantageous in that the first coil structure and the second coil structure can be arranged alternatively. As such, the space between the adjacent first coil structure and the second coil structure can be reduced, thereby reducing the occupied area of the balun structure.

In some other embodiments, the linewidth of the first upper-layer metal wire can be shorter than the linewidth of the first lower-layer metal wire, and the linewidth of the outer second upper-layer metal wire can be longer than the linewidth of the outer second lower-layer metal wire. That is, the cross section of the first coil structure can have the second "I" shape, and the cross section of the second coil structure can have the first "I" shape.

Specifically, the linewidth D112u of the first upper-layer metal wire 112u can be in a range from about 1 μm to about 100 μm. The linewidth D112d of the first lower-layer metal wire 112d can be in a range from about 1 μm to about 100 μm. In some embodiments, the linewidth D112u of the first upper-layer metal wire 112u can be in a range from about 6.5 μm to about 7.5 μm, such as, about 6.5 μm, about 7.0 μm or about 7.5 μm, etc. The linewidth D112d of the first lower-layer metal wire 112d can be in a range from about 4 μm to about 5 μm, such as, about 4.0 μm, about 4.5 μm or about 5.0 μm, etc.

The outer second upper-layer metal wire 122ou can have a linewidth D122ou in a range from about 1 μm to about 100 μm, and the outer second lower-layer metal wire 122od can have a linewidth D122od in a range from about 1 μm to about 100 μm. In some embodiments, the linewidth D122ou of the outer second upper-layer metal wire 122ou can be in a range from about 3.5 μm to about 4.5 μm, such as, about 3.5 μm, about 4.0 μm or about 4.5 μm, etc. The linewidth D122od of the outer second lower-layer metal wire 122od can be in a range from about 5.5 μm to about 6.5 μm, such as, about 5.5 μm, about 6.0 μm or about 6.5 μm, etc.

It should be noted that, the distance between the first upper-layer metal wire 112u and the second upper-layer metal wire can be smaller than the distance between the first lower-layer metal wire 112d and the second lower-layer metal wire. In some embodiments, the distance $W_u$ between the first upper-layer metal wire 112u and the outer second upper-layer metal wire 122ou is smaller than the distance $W_d$ between the first lower-layer metal wire 112d and the outer second lower-layer metal wire 122od. As such, the spacing between the adjacent first coil structure and the second coil structure can be reduced, thereby reducing the occupied area of the balun structure.

Specifically, the distance between the first upper-layer metal wire 112u and the second upper-layer metal wire can be in a range from about 1 μm to about 100 μm. The distance between the first lower-layer metal wire 112d and the second lower-layer metal wire can be in a range from about 1 μm to about 100 μm. That is, the distance $W_u$ between the first upper-layer metal wire 112u and the outer second upper-layer metal wire 122ou can be in a range from about 1 μm to about 100 μm. And the distance $W_d$ between the first lower-layer metal wire 112d and the outer second lower-layer metal wire 122od can be in a range from about 1 μm to about 100 μm.

In some embodiments, the distance $W_u$ between the first upper-layer metal wire 112u and the outer second upper-layer metal wire 122ou can be in a range from about 1.750 μm to about 2.250 μm, such as, about 1.750 μm, about 2.00 μm or about 2.250 μm. The distance $W_d$ between the first lower-layer metal wire 112d and the outer second lower-layer metal wire 122od can be in a range from about 2.250 μm to about 2.750 μm, such as, about 2.250 μm, about 2.500 μm or about 2.750 μm.

It should be noted that, the first single-layer coil 111, the first upper-layer metal wire 112u, the first connecting line, the outer second upper-layer metal wire 122ou, and the fourth connecting line may be realized through a top metal layer on the dielectric layer 101. Therefore, the material of the first single layer coil 111, the first upper-layer metal wire 112u, the first connecting line, the outer second upper-layer metal wire 122ou, and the fourth connecting line may be copper.

The second single-layer coil 121, the first lower-layer metal wire 122d, the second connecting line, the outer second lower metal wire 122od, and the third connecting line may be realized through a bottom metal layer on the substrate 100. Therefore, the material of the second single-layer coil 121, the first lower-layer metal wire 122d, the second connecting line, the outer second lower-layer metal wire 122od, and the third connecting line may be aluminum.

Still referring to FIG. 3, a ratio of windings in the balun structure can be related to a ratio between a first summation of windings of the first laminated coils 112 and the first single-layer coil in the first coil structure 110, and a second summation of the windings of second laminated coils 122 and the second single-layer coil in the second coil structure 120.

Assume there are number $N_{112}$ of the first laminated coils 112 and number $N_{122}$ of the second laminated coils 112. Also, there is one first single-layered coil 111 and one second single-layered coil 121. Then the ratio of windings in the balun structure can be equal to $(N_{112}+1): (N_{122}+1)$. In some embodiments, the ratio of windings in the balun structure, which is the voltage ratio of the balun structure, can be equal to 2:3.

It should be noted that, the structure of the inner coils in the balun structure can be octagonal shaped. That is, the first coil structure and the second coil structure can have an octagonal shape. However, in some other embodiments, the configuration of the inner coils of the balun structure may be other shapes such as a square shape, a circular shape, or a rhombic shape.

Figure 7:
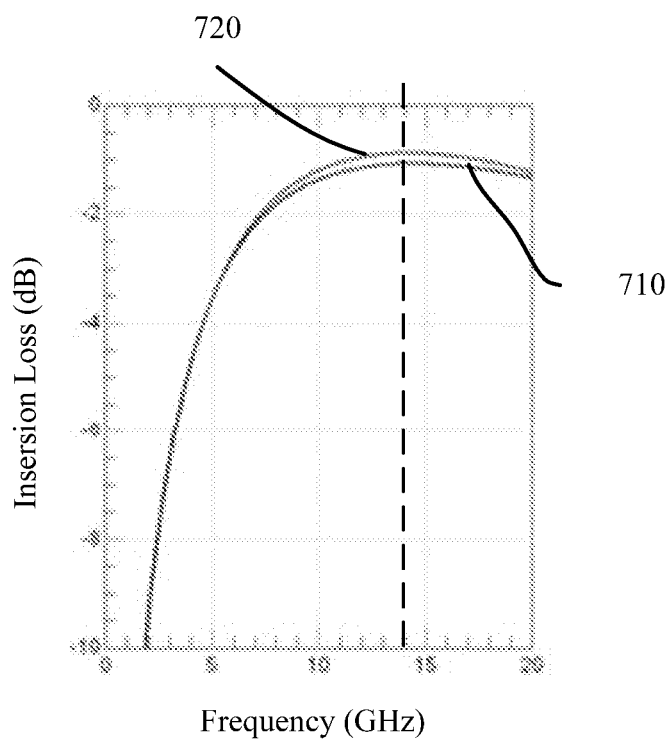
FIG. 7 illustrates a schematic diagram of a relationship between insertion loss and frequency of the balun structure shown in FIG. 3.

Referring to FIG. 7, a schematic diagram of a relationship between the insertion loss and the frequency of the balun structure is shown.

The abscissa indicates the frequency of the input signal and the ordinate indicates the magnitude of the insertion loss. Curve 710 represents the insertion loss versus frequency for a conventional balun structure and curve 720 represents the insertion loss versus frequency for the disclosed balun structure shown in FIG. 3.

As illustrated, at the same frequency, the absolute value of the insertion loss of the disclosed balun structure represented by curve 720 is less than the absolute value of the insertion loss of the conventional balun structure represented by curve 710. Moreover, compared with the conventional balun structure, the occupied area of the disclosed balun structure is reduced by about 23%, the insertion loss is reduced by about 0.16 dB or about 12%, the differential quality factor is improved by about 5%, and the coupling efficiency is improved by about 6.4%.

Figure 9:
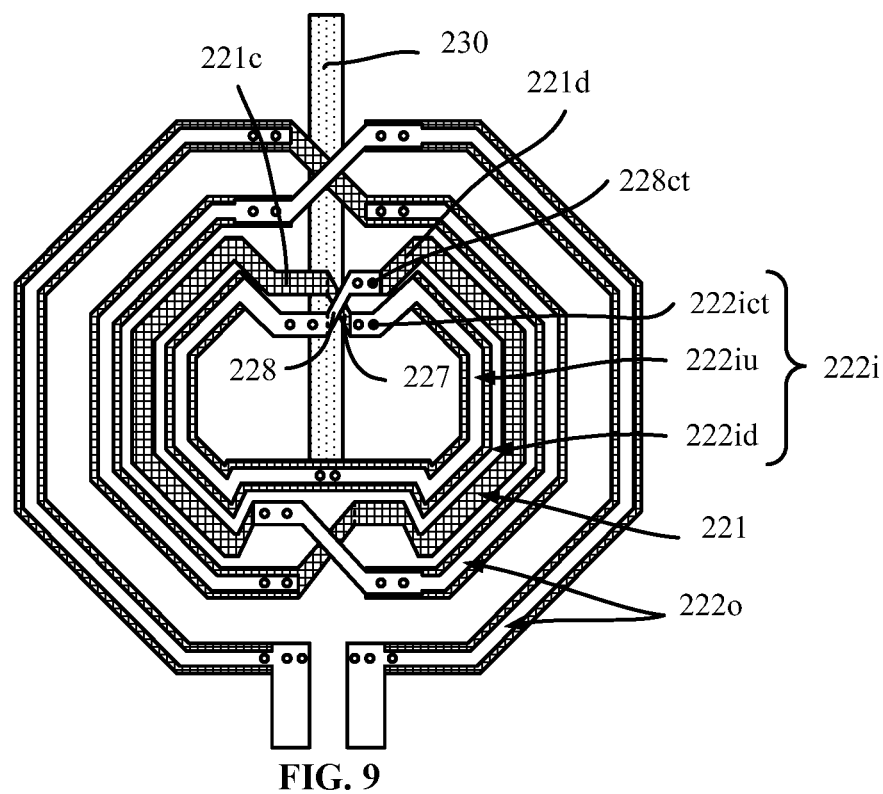
FIG. 9 illustrates a schematic structural top view of another exemplary differential coil shown in FIG. 8.
Figure 10:
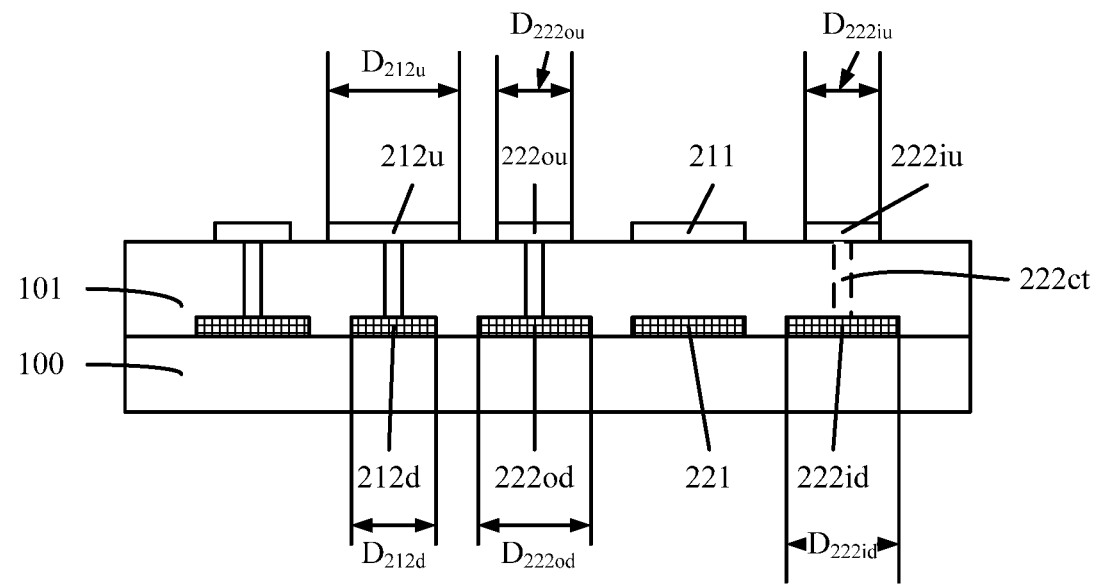
FIG. 10 illustrates a schematic structural cross-sectional view of the balun structure shown in FIG. 8 along a CC line.

Referring to FIGS. 9-10, schematic structural diagrams of another exemplary balun structure are shown in accordance with some other embodiments of the present disclosure.

Figure 8:
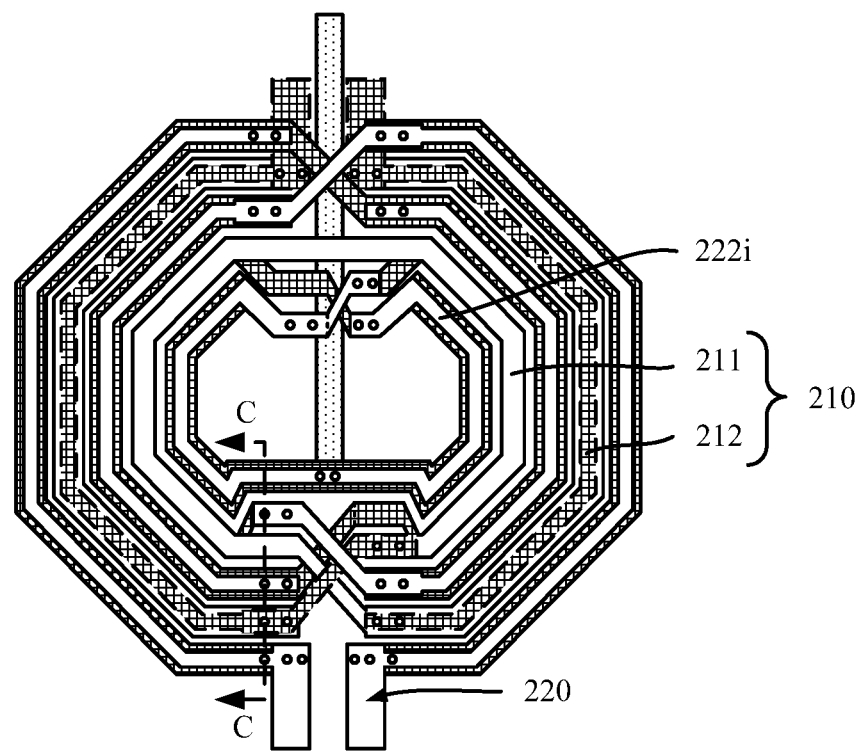
FIG. 8 illustrates a schematic structural top view of another exemplary balun structure in accordance with some other embodiments of the present disclosure.

FIG. 8 illustrates a schematic structural top view of the balun structure. FIG. 9 illustrates a schematic structural top view of a differential coil in the balun structure shown in FIG. 8. FIG. 10 illustrates a schematic structural cross-sectional view of the balun structure shown in FIG. 8 along a CC line. It should be noted that, in FIGS. 8 and 9, the substrate and the dielectric layer are not shown.

It also should be noted that, the portions of the disclosed balun structure shown in FIGS. 8-10 that are same to the corresponding portions of the disclosed balun structure described above in connection with FIGS. 3-6 are not repeated herein. The different portions of the disclosed balun structure are described in details in the following.

As illustrated in FIGS. 8-10, the second coil structure can further include an inner second laminated coil.

Specifically, the second laminated coil can further include an inner second laminated coil 222i. The second single-layer coil can surround the inner second laminated coil 222i. It should be noted that, since the projection of the second single-layer coil on the surface of the substrate overlaps with the projection of the first single-layer coil 211 on the surface of the substrate, the first single-layered coil 211 also surrounds the inner second laminated coil 222i.

Referring to FIG. 9, a schematic structural top view of a differential coil in the balun structure shown in FIG. 8 is illustrated.

As shown, the number of the inner second laminated coil 222i can be one. The second coil structure can further include two outer second laminated coils 222o. That is, the second coil structure can include one inner second laminated coil 222i, one second single-layered coil 221 surrounding the inner second laminated coil 222i, and two outer second laminated coils 222o successively surrounding the second single-layer coil 121.

In some embodiments, the second single-layer coil 221 can further include a fifth end 221c and a sixth end 221d for connecting to the adjacent inner second laminated coil 222i. The inner second laminated coil 222i can include multiple inner second upper-layer metal wires 222iu on the dielectric layer, and multiple inner second lower-layer metal wires 222id on the substrate. The inner second lower-layer metal wires 222id can be located at positions corresponding to the inner second upper-layer metal wires 222iu.

The inner second laminated coil 222i can further include multiple third conductive plugs 222cc located between the inner second upper-layer metal wires 222iu and the inner second lower-layer metal wires 222id. The multiple third conductive plugs 222cc can be used for electrically connecting the inner second upper-layer metal wires 222iu and the inner second lower-layer metal wires 222id.

To achieve the connection between the second single-layer coil 221 and the inner second laminated coil 222i, the second coil structure can further include a fifth connecting line 227 on the substrate, a sixth connecting line 228 on the dielectric layer 228, and a third connecting plug 228ct at one end of the sixth connecting line 228.

One end of the fifth connecting line 227 can be connected to the fifth end 221c of the second single-layered coil 221, and the other end of the fifth connecting line 227 can be connected to one end of the adjacent inner second lower-layer metal wire 222id.

One end of the sixth connecting line 228 and the sixth end 221d of the second single-layer coil 221 can be connected to each other through the third connecting plug 228ct. And the other end of the sixth connecting line 228 can be connected to one end of the adjacent inner second upper-layer metal wire 222iu.

It should be noted that, in order to make the second coil structure in a spiral shape, the fifth connecting line 227 and the sixth connecting line 228 can be arranged in an "X" shape. That is, the projections of the fifth connecting line 227 and the sixth connecting line 228 on the surface of the substrate can overlap to each other. And the projections of the fifth connecting line 227 and the sixth connecting line 228 on the surface of the substrate can have an "X" shape.

Since the number of the inner second laminated coil 222i is one, the inner second upper-layer metal wire 222iu and the inner second lower-layer metal wire 222id are not segmented and directly wound into coils.

In some other embodiments, when the numbers of the inner second laminated coils 222i is greater than one, the inner second upper-layer metal wire 222iu and the inner second lower-layer metal wire 222id may be divided into multiple line segments to form the second coil structure as a spiral shape.

In some embodiments, the second coil structure is a differential coil in the balun structure. Thus the second coil structure can further include a center tap 230 connecting to the inner second laminated coil 222i.

Referring to FIG. 10, a schematic structural cross-sectional view of the balun structure shown in FIG. 8 along a CC line is illustrated.

In order to reduce the occupied area of the balun structure, in some embodiments, the linewidth D212u of the first upper-layer metal wire 212u can be larger than the linewidth D212d of the first lower-layer metal wire 212d. The linewidth of the outer second upper-layer metal wire 222ou can be smaller than the linewidth D222od of the outer second lower-layer metal wire 222od. The linewidth D222iu of the inner second upper-layer metal wire 222iu can be smaller than the linewidth D222id of the inner second lower-layer metal wire 222id.

In the cross section that is vertical to the extension direction, the cross section of the first coil structure including the first upper-layer metal wire 212u and the first lower-layer metal wire 212d can have a first "I" shape, where the upper transverse line of the first "I" shape is longer than the lower transverse line of the first "I" shape. The cross section of the second coil structure including the outer second upper-layer metal wire 222iu, the outer second lower-layer metal wire 222id, the inner second upper-layer metal wire 222ou and the inner second lower-layer metal wire 222od can have a second "I" shape, where the upper transverse line of the second "I" shape is shorter than the lower transverse line of the second "I" shape.

The first coil structure and the second coil structure having the above-described shapes are advantageous in that the first coil structure and the second coil structure can be arranged alternatively. As such, the space between the adjacent first coil structure and the second coil structure can be reduced, thereby reducing the occupied area of the balun structure.

It should be noted that, in some other embodiments, the linewidth of the first upper-layer metal wire can be smaller than the linewidth of the first lower-layer metal wire, the linewidth of the outer second upper-layer metal wire can be longer than the linewidth of the outer second lower-layer metal wire, and the linewidth of the inter second upper-layer metal wire can be shorter than the linewidth of the inter second lower-layer metal wire. That is, the cross section of the first coil structure can have the second "I" shape, and the cross section of the second coil structure can have the first "I" shape.

Specifically, the linewidth D222*iu* of the inner second upper-layer metal wire 222*iu* can be in a range from about 1 μm to about 100 μm, and the linewidth D222*id* of the inner second lower-layer metal wire 222*id* can be in a range from about 1 μm to about 100 μm. In some embodiments, the linewidth D222*iu* of the inner second upper-layer metal wire 222*iu* can be in a range from about 3.5 μm to about 4.5 μm, such as, about 3.5 μm, about 4.0 μm or about 4.5 μm, etc. The line of the inner second lower-layer metal wire 222*id* can be in a range from about 5.5 μm to about 6.5 μm, such as, about 5.5 μm, about 6.0 μm or about 6.5 μm, etc.

In some embodiments, the inner second upper-layer metal wire 222*iu* and the sixth connecting line 228 as shown in FIG. 9 may be realized by a top metal layer located on the dielectric layer 101. That is, the first single-layer coil 211, the first upper-layer metal wire 212*u*, the first connecting line, the outer second upper-layer metal wire 222*ou*, the fourth connecting line, the inner second upper-layer metal line 222*iu*, and the sixth connecting line 228 may be realized by the top metal layer. The material of the first single-layer coil 211, the first upper-layer metal wire 212*u*, the first connecting line, the outer second upper-layer metal wire 222*ou*, the fourth connecting line, the inner second upper-layer metal line 222*iu*, and the sixth connecting line 228 may be copper The inner second lower-layer metal wire 222*id* and the fifth connecting line 227 as shown in FIG. 9 may be realized by a bottom metal layer located on the substrate 100. That is, the second single-layer coil 221, the first lower-layer metal wire 212*d*, the second connecting line, the outer second lower-layer metal wire 222*od*, the third connecting line, the inner second lower-layer metal wire 222*id*, and the fifth connecting line 227 may be realized by the bottom metal layer. A material of the second single-layer coil 221, the first lower-layer metal wire 212*d*, the second connecting line, the outer second lower-layer metal wire 222*od*, the third connecting line, the inner second lower-layer metal wire 222*id*, and the fifth connecting line 227 may be aluminum.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a balun structure is provided. In some embodiments, the disclosed balun structure may be an on-chip balun structure for RFIC design.

The disclosed balun structure may include interleaved spiral coils and differential coils. The most inner windings of spiral and differential coils can adapt single metal layer, the other coils can include two parallel metal layers with different width. The most outer coil can be differential coil.

In some embodiments, the most inner winding of spiral coils can be stacked on the inner differential coils to save area and increase self and mutual inductances and electromagnetic coupling. The coils can be fully stacked or partially stacked for better differential quality factor Q.

In some embodiments, the most outer winding of spiral coil can adapt parallel metal layers with "T" shaped section. The width of bottom metal layer can be thinner than top metal layer. The top and bottom metal layers can be in parallel connection by metal via hole. The thinner bottom metal can help reduce area, the wider top metal can help reduce coil resistance for better differential quality factor Q performance and also increase electromagnetic coupling between top and bottom coils. The top metal spacing of "T" shaped coil can be less than that of bottom metal coils to improve electromagnetic coupling effect.

In the disclosed balun structure, the electromagnetic coupling between the first coil structure and the second coil structure can be realized not only along a lateral direction in the plane parallel to the surface of the substrate, but also along a vertical direction perpendicular to the surface of the substrate, e.g., between the first single-layer coil and the second single-layer coil. The above disclosed technical solution can effectively increase the area of the electromagnetic coupling between the first coil structure and the second coil structure, thereby improving the electromagnetic coupling efficiency. For the same coupling requirement, the disclosed balun structure can have reduced numbers of the first laminated coils and second laminated coils. Therefore, the area of the first coil structure and the second coil structure can be effectively reduced, thereby reducing the occupied area of the balun structure.

Further, in some embodiments, the linewidth of the first upper-layer metal wire can be longer than the linewidth of the first lower-layer metal wire, the linewidth of the outer second upper-layer metal wire can be shorter than the linewidth of the outer second lower-layer metal wire, and the linewidth of the first upper-layer metal wire can be shorter than the linewidth of the inner second lower-layer metal wire. Alternatively, the linewidth of the first upper-layer metal wire can be shorter than the linewidth of the first lower-layer metal wire, the linewidth of the outer second upper-layer metal wire can be longer than the linewidth of the outer second lower-layer metal wire, and the linewidth of the inner second upper-layer metal wire can be longer than the linewidth of the inner second lower-layer metal wire. As such, the first laminated coil and the second laminated coil can respectively have a first "I" shaped and a second "I" shape. Thus, the first laminated coil and the second laminated coil can be arranged alternatively, thereby reducing the spacing between the first laminated coil and second laminated coil. Therefore, the areas of the first coil structure and second coil structure can be reduced, thereby reducing the occupied area of the balun structure.

Although the present disclosure has been described and illustrated in the foregoing illustrative embodiments, it is understood that the present disclosure has been made only by way of example, and that numerous changes in the details of embodiment of the present disclosure can be made without departing from the spirit and scope of the present disclosure, which is only limited by the claims which follow. Features of the disclosed embodiments can be combined and rearranged in various ways. Without departing from the spirit and scope of the present disclosure, modifications, equivalents, or improvements to the present disclosure are understandable to those skilled in the art and are intended to be encompassed within the scope of the present disclosure.

What is claimed is:
1. A balun structure, comprising:
   a substrate;
   a first coil structure having a spiral shape and on the substrate, the first coil structure including:
      a first single-layer coil, and
      at least one first laminated coil connected to the first single-layer coil, wherein the first single-layer coil is surrounded by the at least one first laminated coil; and
a second coil structure having a spiral shape and on the substrate, the second coil structure including:
a second single-layer coil, a projection of the second single-layer coil on a surface of the substrate overlaps a projection of the first single-layer coil on the surface of the substrate, and
at least one second laminated coil connected to the second single-layer coil,
wherein a number of the at least one second laminated coil is larger than or equal to a number of the at least one first laminated coil, and the at least one second laminated coil is arranged alternately with the at least one first laminated coil or the first single-layer coil in a plane parallel to the surface of the substrate.

2. The balun structure of claim 1, wherein:
the second single-layer coil is on the substrate;
the first single-layer coil is on a dielectric layer; and
the first laminated coil includes:
a plurality of first upper-layer metal wires positioned on the dielectric layer,
a plurality of first lower-layer metal wires on the substrate, each first lower-layer metal wire being located corresponding to one first upper-layer metal wire, and
a plurality of first conductive plugs located between the first upper-layer metal wires and the first lower-layer metal wires.

3. The balun structure of claim 2, wherein:
the first coil structure further includes:
a first connecting line on the dielectric layer for connecting the first single-layer coil and one adjacent first upper-layer metal wire,
a second connecting line on the substrate and connecting the first single-layer coil and one adjacent first lower-layer metal wire, and
a first connecting plug located at one end of the second connecting line for connecting the second connecting line and the first single-layer coil; and
the at least one second laminated coil includes an outer second laminated coil surrounding the second single-layer coil, the outer second laminated coil including:
a plurality of outer second upper-layer metal wires on the dielectric layer,
a plurality of outer second lower-layer metal wires on the substrate, each outer second lower-layer metal wire being located corresponding to one outer second upper-layer metal wire, and
a plurality of second conductive plugs between the outer second upper-layer metal wires and the outer second lower-layer metal wires; and
the second coil structure further includes:
a third connecting line on the substrate for connecting the second single-layer coil and one adjacent outer second lower-layer metal wire,
a fourth connecting line on the dielectric layer for connecting the second single-layer coil and one adjacent outer second upper-layer metal wire, and
a second connecting plug located at one end of the fourth connecting line for connecting the fourth connecting line and the second single-layer coil.

4. The balun structure of claim 3, wherein:
a linewidth of the first upper-layer metal wire is longer than a linewidth of the first lower-layer metal wire, and a linewidth of the outer second upper-layer metal wire is shorter than a linewidth of the outer second lower-layer metal wire; or
the linewidth of the first upper-layer metal wire is shorter than the linewidth of the first lower-layer metal wire, and the linewidth of the outer second upper-layer metal wire is longer than the linewidth of the outer second lower-layer metal wire.

5. The balun structure of claim 3, wherein:
the at least one second laminated coil further includes an inner second laminated coil surrounded by the second single-layer coil;
the inner second laminated coil includes:
a plurality of inner second upper-layer metal wires on the dielectric layer,
a plurality of inner second lower-layer metal wires on the substrate, each inner second lower metal wire is located corresponding to one inner second upper-layer metal wire, and
a plurality of third conductive plugs between the inner second upper-layer metal wires and the inner second lower-layer metal wires and the inner second upper metal wire; and
the second coil structure further includes:
a fifth connecting line on said substrate for connecting the second single-layer coil and one adjacent inner second lower-layer metal wire,
a sixth connecting line on the dielectric layer for connecting the second single-layer coil and one adjacent inner second upper-layer metal wire, and
a third connecting plug located at one end of the sixth connecting line for connecting the sixth connecting line and the second single-layer coil.

6. The balun structure of claim 5, wherein:
a linewidth of the first upper-layer metal wire is longer than a linewidth of the first lower-layer metal wire, a linewidth of the outer second upper-layer metal wire is shorter than a linewidth of the outer second lower-lay metal wire, and a linewidth of the inner second upper-layer metal wire is shorter than a linewidth of the inner second lower-layer metal wire; or
the linewidth of the first upper-layer metal wire is shorter than the linewidth of the first lower-layer metal wire, the linewidth of the outer second upper-layer metal wire is longer than the linewidth of the outer second lower-lay metal wire, and the linewidth of the inner second upper-layer metal wire is longer than the linewidth of the inner second lower-layer metal wire.

7. The balun structure of claim 1, wherein:
a number of the at least one first laminated coil is less than or equal to four.

8. The balun structure of claim 1, wherein:
a number of the at least one second laminated coil is less than or equal to four.

9. The balun structure of claim 1, wherein:
a linewidth of the first single-layer coil is in a range from about 1 μm to about 100 μm; and
a linewidth of the second single-layer coil is in a range from about 1 μm to about 100 μm.

10. The balun structure of claim 4, wherein:
a linewidth of the first upper-layer metal wire s in a range from about 1 μm to about 100 μm; and
a linewidth of the first lower-layer metal wire is in a range from about 1 μm to about 100 μm.

11. The balun structure of claim 4, wherein:
a linewidth of the outer second upper-layer metal wire s in a range from about 1 μm to about 100 μm; and a linewidth of the outer second lower-layer metal wire is in a range from about 1 µm to about 100 µm.

12. The balun structure of claim 4, wherein:
a linewidth of the inner second upper-layer metal wire is in a range from about 1 µm to about 100 µm; and
a linewidth of the inner second lower-layer metal wire is in a range from about 1 µm to about 100 µm.

13. The balun structure of claim 3, wherein:
a distance between the first upper-layer metal wire and the second upper-layer metal wire is shorter than a distance between the first lower-layer metal wire and the second lower-layer metal wire.

14. The balun structure of claim 13, wherein:
the distance between the first upper-layer metal wire and the second upper-layer metal wire is in a range from about 1 µm to about 100 µm.

15. The balun structure of claim 13, wherein:
the distance between the first lower-layer metal wire and the second lower-layer metal wire is in a range from about 1 µm to about 100 µm.

16. The balun structure of claim 3, wherein:
a material of the first single-layer coil, the first upper-layer metal wire, the first connecting line, the outer second upper-layer metal wire, and the fourth connecting line is copper.

17. The balun structure of claim 3, wherein:
a material of the second single-layer coil, the first lower-layer metal wire, the second connecting line, the outer second lower-layer metal wire, and the third connecting line is aluminum.

18. The balun structure of claim 5, wherein:
a material of the first single-layer coil, the first upper-layer metal wire, the first connecting line, the outer second upper-layer metal wire, the fourth connecting line, the inner second upper-layer metal wire, and the sixth connecting line is copper.

19. The balun structure of claim 5, wherein:
a material of the second single-layer coil, the first lower-layer metal wire, the second connecting line, the outer second lower-layer metal wire, the third connecting line, the inner second lower-layer metal wire, and the fifth connecting line is aluminum.

20. The balun structure of claim 1, wherein:
the first coil structure is a differential coil, and the second coil structure is a spiral coil; or
the first coil structure is a spiral coil, and the second coil structure is a differential coil.

* * * * *